(12) United States Patent
Rudhard

(10) Patent No.: US 6,436,821 B1
(45) Date of Patent: Aug. 20, 2002

(54) METHOD FOR PRODUCING A MICROMECHANICAL STRUCTURE AND A MICROMECHANICAL STRUCTURE

(75) Inventor: Joachim Rudhard, Leinfelden-Echterdingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/992,939

(22) Filed: Nov. 5, 2001

(30) Foreign Application Priority Data

Nov. 9, 2000 (DE) .......................... 100 55 421

(51) Int. Cl.⁷ .............................................. H01L 21/44
(52) U.S. Cl. .................... 438/672; 438/655; 438/657; 438/683
(58) Field of Search ................... 438/655, 657, 438/667, 672, 682, 683

(56) References Cited

U.S. PATENT DOCUMENTS

| | | | | |
|---|---|---|---|---|
| 4,614,119 A | * | 9/1986 | Zavracky et al. | 73/704 |
| 5,417,801 A | * | 5/1995 | Bol | 216/2 |
| 5,837,562 A | * | 11/1998 | Cho | 438/51 |
| 6,192,757 B1 | * | 2/2001 | Tsang et al. | 73/514.32 |
| 6,198,300 B1 | * | 3/2001 | Doezema et al. | 324/762 |

* cited by examiner

Primary Examiner—T. N. Quach
(74) Attorney, Agent, or Firm—Kenyon & Kenyon

(57) ABSTRACT

A method for producing a micromechanical structure, and a micromechanical structure having a movable structure and a stationary structure made of silicon. In the method for producing the micromechanical structure, in one process step, a superficial metal-silicide layer is produced in the movable structure and/or the stationary structure.

6 Claims, 2 Drawing Sheets

METHOD FOR PRODUCING A MICROMECHANICAL STRUCTURE AND A MICROMECHANICAL STRUCTURE

BACKGROUND INFORMATION

Methods for producing a micromechanical structure or micromechanical structures are already known, in which a movable silicon structure and a stationary silicon structure are provided which are movable relative to one another.

SUMMARY OF THE INVENTION

The method according to the present invention for producing a micromechanical structure, and the micromechanical structure of the present invention have the advantage that superficial, conductive metal-silicide layers are provided. Electrostatic surface charges on the micromechanical structures can be prevented by these conductive metal-silicide layers. Adhesion of the micromechanical structures to one another is thereby also reduced.

The metals indicated are especially suitable for forming metal-silicide layers. Both polycrystalline and monocrystalline silicon is suitable as material for the structures. The method can be used particularly easily in connection with producing silicon structures on sacrificial layers, particularly on a support.

DETAILED DESCRIPTION

Figure 1:
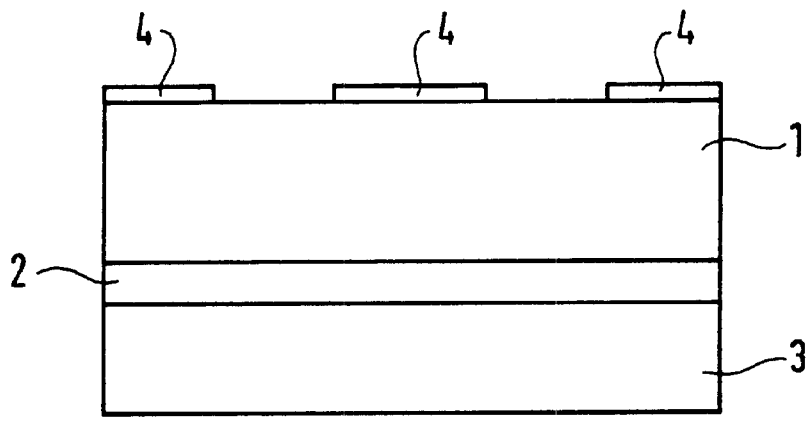
FIG. 1 shows a first method step for producing a micromechanical structure.

FIG. 1 shows a cross-section through a silicon layer 1 that is arranged by way of a sacrificial layer 2 on a support 3. The layer thicknesses shown here are not true to scale. Typically, silicon layer 1 is between 2 and approximately 30 $\mu$m thick. Layer thicknesses on the order of magnitude of a few micrometers are usually used for sacrificial layer 2. For support 3, usually boards (plates) having a thickness of more than 500 $\mu$m are used, since only in this way is a sufficient mechanical stability of the entire construction provided.

Silicon layer 1 can be made both of polycrystalline silicon and of monocrystalline silicon. For sacrificial layer 2, any material is suitable which can be etched selectively with respect to the silicon of layer 1. A typical material for a sacrificial layer 2 is, for example, silicon oxide or phosphorus silicate glass. Support 3 should, above all, ensure a stable mechanical construction. Customary materials for support 3 are, for example, silicon, silicon oxide or ceramic materials.

A preferred construction is made of a silicon wafer for support 3, a sacrificial layer of silicon oxide and a polycrystalline silicon layer 1.

Applied on the top side of silicon layer 1 is a masking 4 which, in FIG. 1, is already patterned. Patterned masking 4 is used to introduce a structure into silicon layer 4 in an etching step. Metals, silicon oxide, silicon nitride, photoresist or a multilayer build-up of these materials are suitable as materials for masking 4. In the following etching step, an etch attack of silicon layer 1 takes place only where it is not covered by masking 4.

Figure 2:
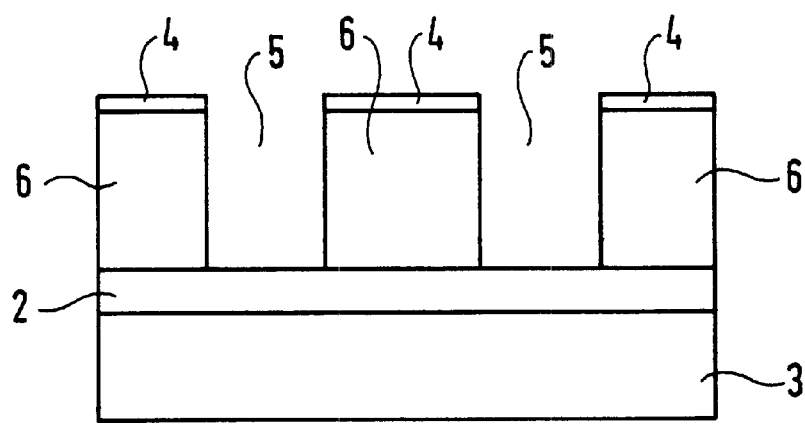
FIG. 2 shows a second method step for producing a micromechanical structure.

FIG. 2 shows the result of such an etching step used on the layer construction according to FIG. 1. By etching in using an anisotropic etching process, which in particular forms vertical etching flanks, trenches 5 have been introduced into silicon layer 1. Trenches 5 subdivide silicon layer 1 into individual structures 6.

Anistropic plasma etching methods based on fluorine-containing gas mixtures are particularly suitable for structuring silicon layer 1. Such methods are capable of producing vertical etching flanks for trenches 5.

Figure 3:
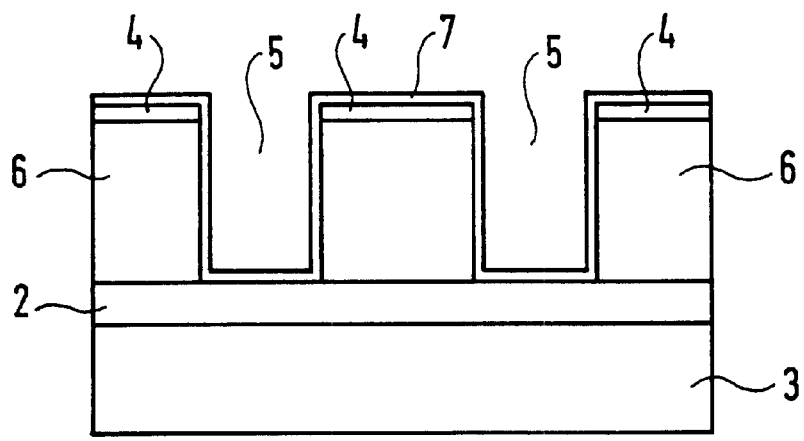
FIG. 3 shows a third method step for producing a micromechanical structure.

In a further processing step, a metal layer 7 is now deposited. This is shown in cross-section in FIG. 3. As FIG. 3 shows, metal layer 7 is deposited in such a way that a more or less uniform deposition results on the entire surface of structures 6 and in trenches 5. In this context, metals are used for metal layer 7 which, by way of a thermal treatment, are able to form a metal silicide with the silicon of silicon layer 1. For example, the metals titanium, zirconium, hafnium, vanadium, chromium, niobium, tantalum, molybdenum, tungsten, cobalt, nickel, palladium and platinum are suitable. These metals are able to form metal suicides which exhibit good electrical conductivity. For example, a particularly suitable material is platinum.

Metal layer 7 must be deposited in such a way that as good a covering as possible results both on the edges and on the vertical side walls of structures 6. In this context, a suitable thickness of metal layer 7 can lie between a few nanometers to several 100 nanometers. Suitable deposition methods are, for example, physical methods such as sputtering or vapor deposition of metal layers. Furthermore, metal layer 7 can also be implemented by chemical methods such as the CVD (chemical vapor deposition) method.

Figure 4:
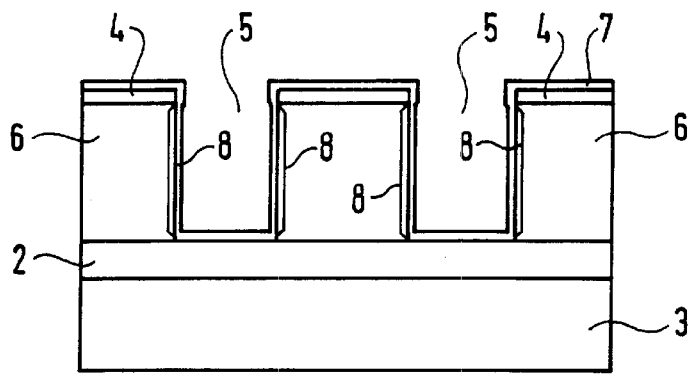
FIG. 4 shows a fourth method step for producing a micromechanical structure.

In a next process step, a metal silicide is now formed. This is shown in FIG. 4. The metal silicide is formed by a thermal treatment, in that the layer construction according to FIG. 3 is exposed to a temperature between, for example, 400° C. and 800° C. Naturally, the selection of the temperature also depends upon the metal used for metal layer 7. For platinum, a temperature between 400° C. and 800° C. is sufficient. This thermal process can be carried out for a few minutes or a few hours depending upon the temperature and the material for the metal. As can be seen in FIG. 4, a superficial metal-silicide layer 8 forms where the metal of metal layer 7 is in direct contact with the silicon of structures 6. In this context, a part of superficial metal layer 7 is used up, or, if metal layer 7 is very thin, this metal layer is completely converted into metal suicide. Since the top side of silicon structures 6 is still covered with masking layer 4, no metal-silicide layer forms in this region. Since in the lower region of trenches 5, metal layer 7 lies on sacrificial layer 2, no metal silicide forms there either.

Figure 5:
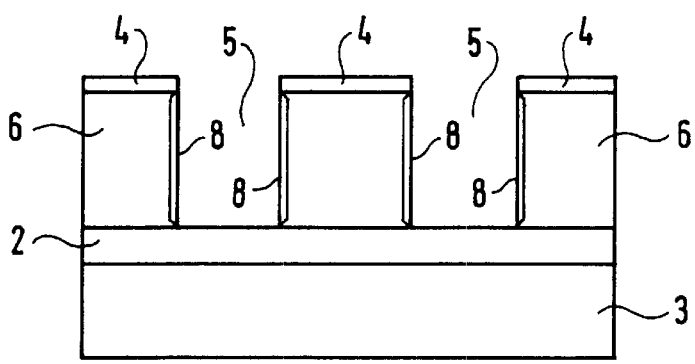
FIG. 5 shows a fifth method step for producing a micromechanical structure.

As a next processing step, metal layer 7 is now etched selectively with respect to metal-silicide layer 8. The chemical properties of metals and metal silicides differ markedly. It is therefore possible, by suitable chemicals, to dissolve metal layer 7 in an etching medium, while the metal-silicide layer is not dissolved by the etching medium. For example, when using platinum for metal layer 7, this platinum layer can be etched by hot aqua regia (nitrohydrochloric acid), while at the same time, the corresponding metal silicide (platinum silicide) is not attacked by this etching medium. By dipping the layer construction according to FIG. 4 into hot aqua regia, metal layer 7 can thus be selectively removed, and metal-silicide layers 8 remain on the surface of silicon structures 6. The result of this etching process is shown in cross-section in FIG. 5. As can be seen there, silicon structures 6 now have vertical side walls which are provided with a metal-silicide layer 8. Masking layers 4, which likewise were not attacked by the etching medium, are still arranged on the top side. For example, in the case of platinum, silicon oxide is a correspondingly suitable masking material for masking 4. It can also be seen in FIG. 5 that no metal layer 7 whatsoever has remained on the structure.

Figure 6:
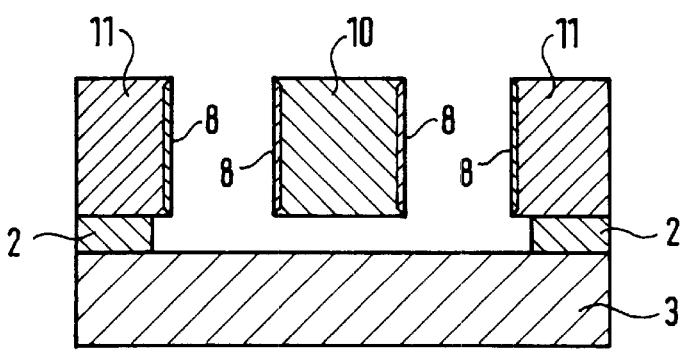
FIG. 6 shows a sixth method step for producing a micromechanical structure.

FIG. 6 shows the result of a further processing step, the etching of sacrificial layer 2; the etching is carried out in such a way that only middle silicon structure 6 is undercut, that is to say, sacrificial layer 2 is completely removed underneath this structure. However, sacrificial layer 2 remains in both silicon structures 6 situated to the right and to the left. Thus, a central, movable silicon structure 10 is produced which is arranged between two stationary silicon structures 11. Silicon structures 10 and 11 have vertical side walls whose surfaces are provided with a metal-silicide layer 8.

Figure 7:
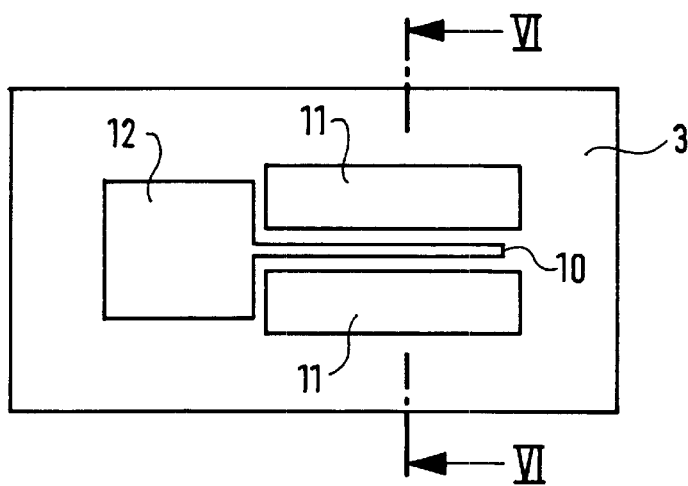
FIG. 7 shows a top view of a micromechanical structure.

FIG. 7 shows, by way of example, a top view of a micromechanical element which has such a movable silicon structure 10 between two stationary silicon structures 11. Also shown schematically is a line of intersection VI—VI which corresponds roughly to FIG. 6. FIG. 6 corresponds only approximately to line of intersection VI—VI, since in FIG. 6, stationary structures 11 to the right and to the left are not shown completely, but are only shown cut off. The reason for this is that the extension of stationary structures 11 to the right and to the left in FIG. 6 would have to be shown considerably larger, which can no longer be reasonably depicted graphically.

FIG. 7 shows here a top view of a micromechanical element, in which a movable structure 10 is arranged between two stationary structures 11. As can be seen, movable structure 10 is joined to a bearing block 12. Stationary structures 11 and bearing block 12 are joined to an underlying support 3 by remnants of a sacrificial layer 2 (which cannot be seen in the top view of FIG. 7). However, movable structure 10 is not joined to underlying support 3. Because of its geometrical dimension, here especially as a long, thin tongue, movable structure 10 is so designed that it is movable relative to substrate 3, and thus also relative to stationary structures 11, by a force influence. Such structures are usable, for instance, as acceleration sensors.

In the case of such micromechanical structures having movable elements and stationary elements, the use of the material silicon is not completely without its problems, since the material silicon is a semi-conductive material. When working with such semi-conductive materials, superficial electrostatic charges cannot be completely ruled out. Such electrostatic surface charges generate forces between the micromechanical structures, particularly when the distances between the structures are small. Because of the poor conductivity of silicon, such electrostatic surface charges can only poorly equalize. Furthermore, when working with micromechanical structures, adhesion of the structures to one another again is always observed. By using a superficial metal-silicide layer, the conductivity of the silicon structures is reduced at least in the area on the surface. The surface charges can be reduced more easily, since they can now move easily both on the surface and into the depth of the silicon. Surface charges are thus reduced by this measure. In addition, this measure has proven to be capable of reducing adhesion of the micromechanical structures to one another.

What is claimed is:

1. A method for producing a micromechanical structure, comprising:

introducing trenches into a silicon layer for forming at least one movable structure and at least one stationary structure from the silicon layer, the movable structure being movable relative to the stationary structure;

after introducing the trenches, depositing a metal layer on side walls of the trenches;

after depositing the metal layer, carrying out a thermal treatment by which metal of the metal layer forms a metal silicide with silicon of the silicon layer; and subsequently carrying out an etching process which removes the metal of the metal layer and does not remove the metal suicide.

2. The method according to claim 1, wherein the metal layer is composed of one of titanium, zirconium, hafnium, vanadium, chromium, niobium, tantalum, molybdenum, tungsten, cobalt, nickel, palladium and platinum.

3. The method according to claim 1, wherein the silicon layer is composed of one of polycrystalline silicon and monocrystalline silicon.

4. The method according to claim 1, wherein the silicon layer is arranged on a sacrificial layer.

5. The method according to claim 4, wherein the sacrificial layer is arranged on a support, the support being composed of one of silicon and glass.

6. The method according to claim 1, wherein the thermal treatment is carried out at a temperature between 400° and 800° C.

* * * * *

UNITED STATES PATENT AND TRADEMARK OFFICE
CERTIFICATE OF CORRECTION

PATENT NO. : 6,436,821 B1
DATED : August 20, 2002
INVENTOR(S) : Rudhard, Joachim It is certified that error appears in the above-identified patent and that said Letters Patent is hereby corrected as shown below:

Column 2,
Line 29, change "suicides" to -- silicides --.
Line 54, change "suicide" to -- silicide --.

Column 4,
Line 35, change "suicide" to -- silicide --.

Signed and Sealed this

Sixteenth Day of September, 2003

JAMES E. ROGAN
*Director of the United States Patent and Trademark Office*